United States Patent
Koolen et al.

(10) Patent No.: US 12,436,470 B2
(45) Date of Patent: Oct. 7, 2025

(54) SUBSTRATE COMPRISING A TARGET ARRANGEMENT, AND ASSOCIATED AT LEAST ONE PATTERNING DEVICE, LITHOGRAPHIC METHOD AND METROLOGY METHOD

(71) Applicant: ASML Netherlands B.V., Veldhoven (NL)

(72) Inventors: Armand Eugene Albert Koolen, Nuth (NL); Simon Gijsbert Josephus Mathijssen, Rosmalen (NL); Hui Quan Lim, Eindhoven (NL); Amanda Elizabeth Anderson, Valkenswaard (NL)

(73) Assignee: ASML Netherlands B.V., Veldhoven (NL)

( * ) Notice: Subject to any disclaimer, the term of this patent is extended or adjusted under 35 U.S.C. 154(b) by 19 days.

(21) Appl. No.: 18/258,521

(22) PCT Filed: Dec. 9, 2021

(86) PCT No.: PCT/EP2021/085058
§ 371 (c)(1),
(2) Date: Jun. 20, 2023

(87) PCT Pub. No.: WO2022/135962
PCT Pub. Date: Jun. 30, 2022

(65) Prior Publication Data
US 2024/0036480 A1   Feb. 1, 2024

(30) Foreign Application Priority Data
Dec. 22, 2020   (EP) .................................... 20216398

(51) Int. Cl.
*G03F 7/00*   (2006.01)

(52) U.S. Cl.
CPC ...... *G03F 7/70633* (2013.01); *G03F 7/70625* (2013.01); *G03F 7/70641* (2013.01); *G03F 7/70683* (2013.01)

(58) Field of Classification Search
CPC ............. G03F 7/70633; G03F 7/70683; G03F 7/70641; G03F 7/70625; G03F 7/70616;
(Continued)

(56) References Cited

U.S. PATENT DOCUMENTS 7,528,953 B2 * 5/2009 Frommer .............. G03F 9/7088
356/401
9,841,688 B2 * 12/2017 Ko ....................... G03F 7/70633
(Continued)

FOREIGN PATENT DOCUMENTS

WO   WO 2009/078708 A1   6/2009
WO   WO 2009/106279 A1   9/2009

OTHER PUBLICATIONS

International Search Report and Written Opinion of the International Searching Authority directed to International Patent Application No. PCT/EP2021/085058, mailed Mar. 21, 2022; 10 pages.
(Continued)

Primary Examiner — Gordon J Stock, Jr.
(74) Attorney, Agent, or Firm — Sterne, Kessler, Goldstein & Fox P.L.L.C.

(57) ABSTRACT

Disclosed is a method of measuring a target on a substrate comprising: illuminating a target with measurement radiation comprising at least a first wavelength, collecting the resultant scattered radiation within a collection numerical aperture; and determining a parameter of interest from said scattered radiation. The target comprises a mediator periodic structure and at least a first target periodic structure each in a respective different layer on the substrate, wherein a pitch of at least the mediator periodic structure is below a single (Continued)

diffraction limit defined by the collection numerical aperture and a wavelength of said measurement radiation, such that said scattered radiation comprises double diffracted radiation, said double diffracted radiation comprising radiation having undergone two sequential same-order diffractions of opposite sign.

15 Claims, 7 Drawing Sheets

(58) Field of Classification Search
CPC ..... G03F 9/7088; G03F 9/7076; G01B 11/14; G01B 11/272; G01B 11/27
See application file for complete search history.

(56) References Cited

U.S. PATENT DOCUMENTS

| | | | | |
|---|---|---|---|---|
| 10,331,043 | B2* | 6/2019 | Van Buel | G01N 21/93 |
| 10,527,952 | B2* | 1/2020 | Grunzweig | G03F 7/70683 |
| 10,606,178 | B2* | 3/2020 | Zwier | G03F 7/7065 |
| 11,281,111 | B2* | 3/2022 | Shalibo | G03F 7/70633 |
| 2010/0201963 | A1 | 8/2010 | Cramer et al. | |
| 2011/0027704 | A1 | 2/2011 | Cramer et al. | |
| 2011/0043791 | A1 | 2/2011 | Smilde et al. | |
| 2011/0073775 | A1 | 3/2011 | Setija et al. | |
| 2011/0102753 | A1 | 5/2011 | Van De Kerkhof et al. | |
| 2012/0242970 | A1 | 9/2012 | Smilde et al. | |
| 2014/0065736 | A1* | 3/2014 | Amir | H01L 22/12 |
| | | | | 257/797 |
| 2017/0268869 | A1* | 9/2017 | Levinski | G01B 11/272 |
| 2017/0293233 | A1 | 10/2017 | Van Der Schaar et al. | |
| 2018/0188663 | A1 | 7/2018 | Levinski et al. | |
| 2019/0219931 | A1 | 7/2019 | Zwier | |
| 2020/0041563 | A1 | 2/2020 | Tinnemans et al. | |

OTHER PUBLICATIONS

International Preliminary Report on Patentability directed to International Patent Application No. PCT/EP2021/085058, issued Jun. 13, 2023; 7 pages.

* cited by examiner

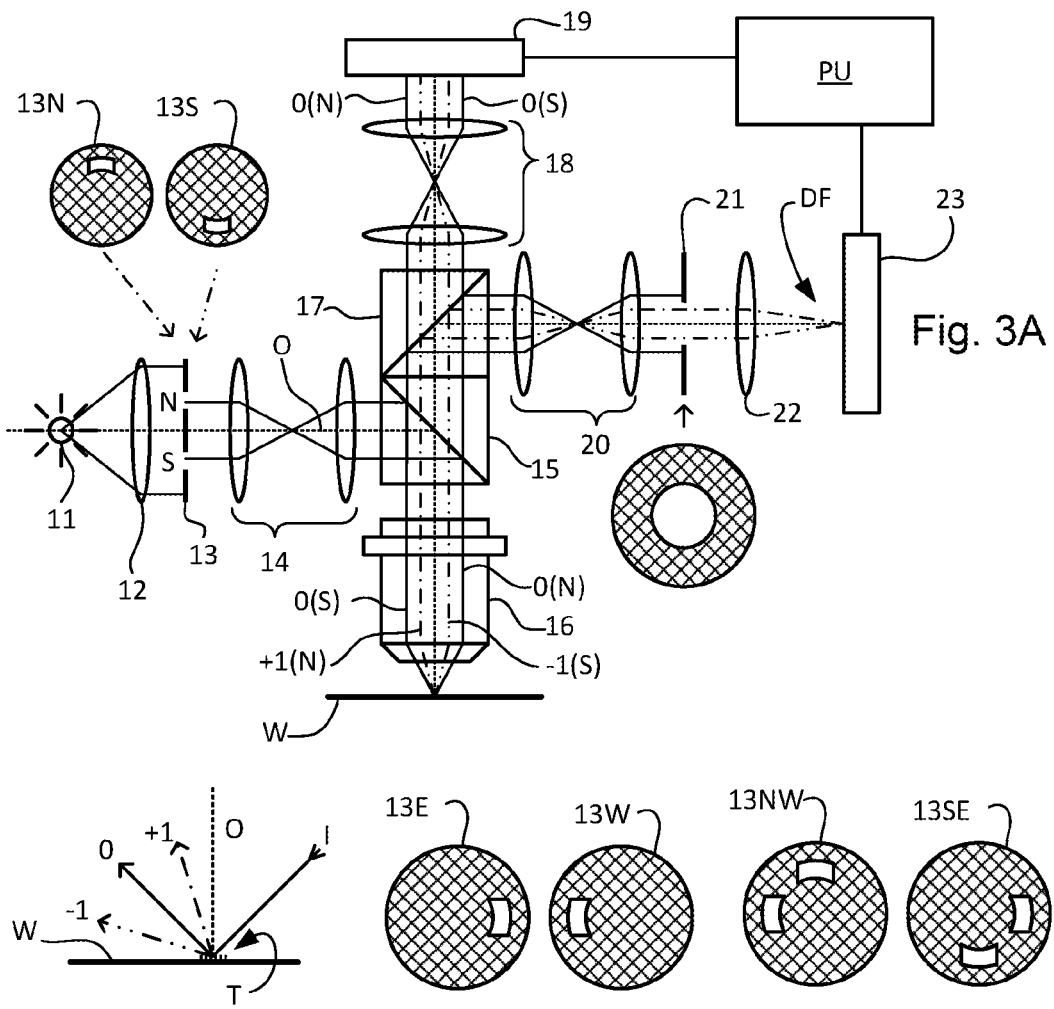
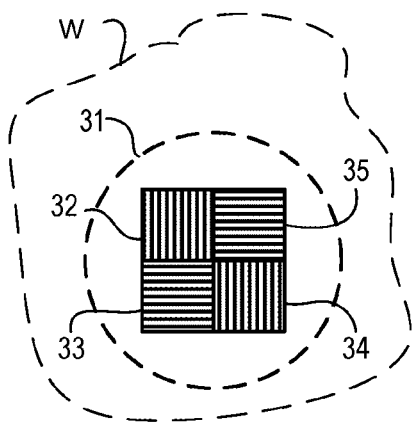
Fig. 4 (prior art)
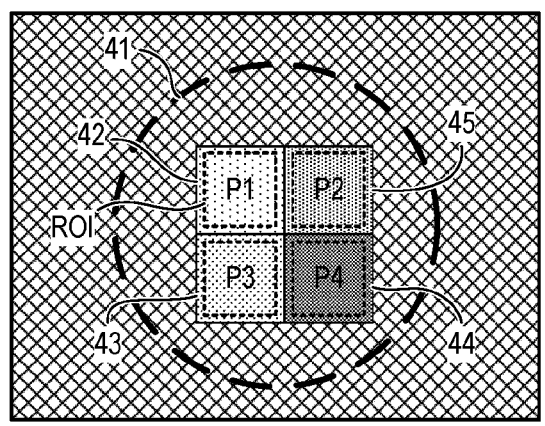
Fig. 5 (prior art)

SUBSTRATE COMPRISING A TARGET ARRANGEMENT, AND ASSOCIATED AT LEAST ONE PATTERNING DEVICE, LITHOGRAPHIC METHOD AND METROLOGY METHOD

CROSS-REFERENCE TO RELATED APPLICATIONS

This application claims priority of EP application 20216398.6 which was filed on Dec. 22, 2020 and which is incorporated herein in its entirety by reference.

FIELD OF THE INVENTION

The present invention relates to a target arrangement for metrology of a lithographic process and to a method to measure a parameter of a lithographic process.

BACKGROUND ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, a measure of the accuracy of alignment of two layers in a device. Overlay may be described in terms of the degree of misalignment between the two layers, for example reference to a measured overlay of 1 nm may describe a situation where two layers are misaligned by 1 nm.

Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target by iterative approaches such as rigorous coupled wave analysis or finite element methods; library searches; and principal component analysis.

The targets used by conventional scatterometers are relatively large, e.g., 40 μm by 40 μm, gratings and the measurement beam generates a spot that is smaller than the grating (i.e., the grating is underfilled). This simplifies mathematical reconstruction of the target as it can be regarded as infinite. However, in order to reduce the size of the targets, e.g., to 10 μm by 10 μm or less, e.g., so they can be positioned in amongst product features, rather than in the scribe lane, metrology has been proposed in which the grating is made smaller than the measurement spot (i.e., the grating is overfilled). Typically such targets are measured using dark field scatterometry in which the zeroth order of diffraction (corresponding to a specular reflection) is blocked, and only higher orders processed. Examples of dark field metrology can be found in international patent applications WO 2009/078708 and WO 2009/106279 which documents are hereby incorporated by reference in their entirety. Further developments of the technique have been described in patent publications US2010027704A, US20110043791A and US20120242970A. Modifications of the apparatus to improve throughput are described in US2010201963A1 and US2011102753A1. The contents of all these applications are also incorporated herein by reference. Diffraction-based overlay using dark-field detection of the diffraction orders enables overlay measurements on smaller targets. These targets can be smaller than the illumination spot and may be surrounded by product structures on a wafer. Targets can comprise multiple gratings which can be measured in one image.

Due to the need to capture propagating diffraction orders within a collection NA, there is an effective limit on the measurement wavelength to pitch ratio, and therefore, given a limit on available or usable wavelengths, an effective limit on target pitches which can be measured.

SUMMARY OF THE INVENTION

It would be desirable to be able to increase flexibility in the size of target pitches which can be measured and/or the wavelengths of measurement illumination to perform a measurement.

The invention in a first aspect provides a method of measuring a target on a substrate comprising: illuminating a target with measurement radiation comprising at least a first wavelength to obtain resultant scattered radiation having been scattered by said target; collecting said scattered radiation within a collection numerical aperture; and determining a parameter of interest from said scattered radiation; wherein the target comprises a mediator periodic structure and at least a first target periodic structure each in a respective different layer on the substrate, wherein a pitch of at least the mediator periodic structure is below a single diffraction limit defined by the collection numerical aperture and a wavelength of said measurement radiation, such that said scattered radiation comprises double diffracted radiation, said double diffracted radiation comprising radiation having undergone two sequential same-order diffractions of opposite sign.

The invention in a second aspect provides a metrology apparatus being operable to perform the method of the first aspect.

The invention in a third aspect provides a substrate comprising a target, wherein the target comprises a mediator periodic structure and at least a first target periodic structure, each in a respective different layer on the substrate, wherein a pitch of at least the mediator periodic structure is below 300 nm, such that radiation scattered by the target comprises double diffracted radiation, said double diffracted radiation comprising radiation having undergone two sequential same-order diffractions of opposite sign.

The invention in a fourth aspect provides a set of reticles comprising a respective reticle comprising features for forming each of said periodic structures to form the substrate of the third aspect.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying drawings in which:

FIGS. 3A-3D comprise, where FIG. 3A is a schematic diagram of a dark field scatterometer for use in measuring targets using a first pair of illumination apertures, FIG. 3B is a detail of diffraction spectrum of a target grating for a given direction of illumination, FIG. 3C is a second pair of illumination apertures providing further illumination modes in using the scatterometer for diffraction based overlay measurements, and FIG. 3D is a third pair of illumination apertures combining the first and second pair of apertures;

FIG. 4 depicts a known form of multiple grating target and an outline of a measurement spot on a substrate;

FIG. 5 depicts an image of the target of FIG. 4 obtained in the scatterometer of FIG. 3;

FIG. 3B showing a second signal path being the time reversed signal path of the first signal path;

DETAILED DESCRIPTION OF EXEMPLARY EMBODIMENTS

Before describing embodiments of the invention in detail, it is instructive to present an example environment in which embodiments of the present invention may be implemented.

Figure 1:
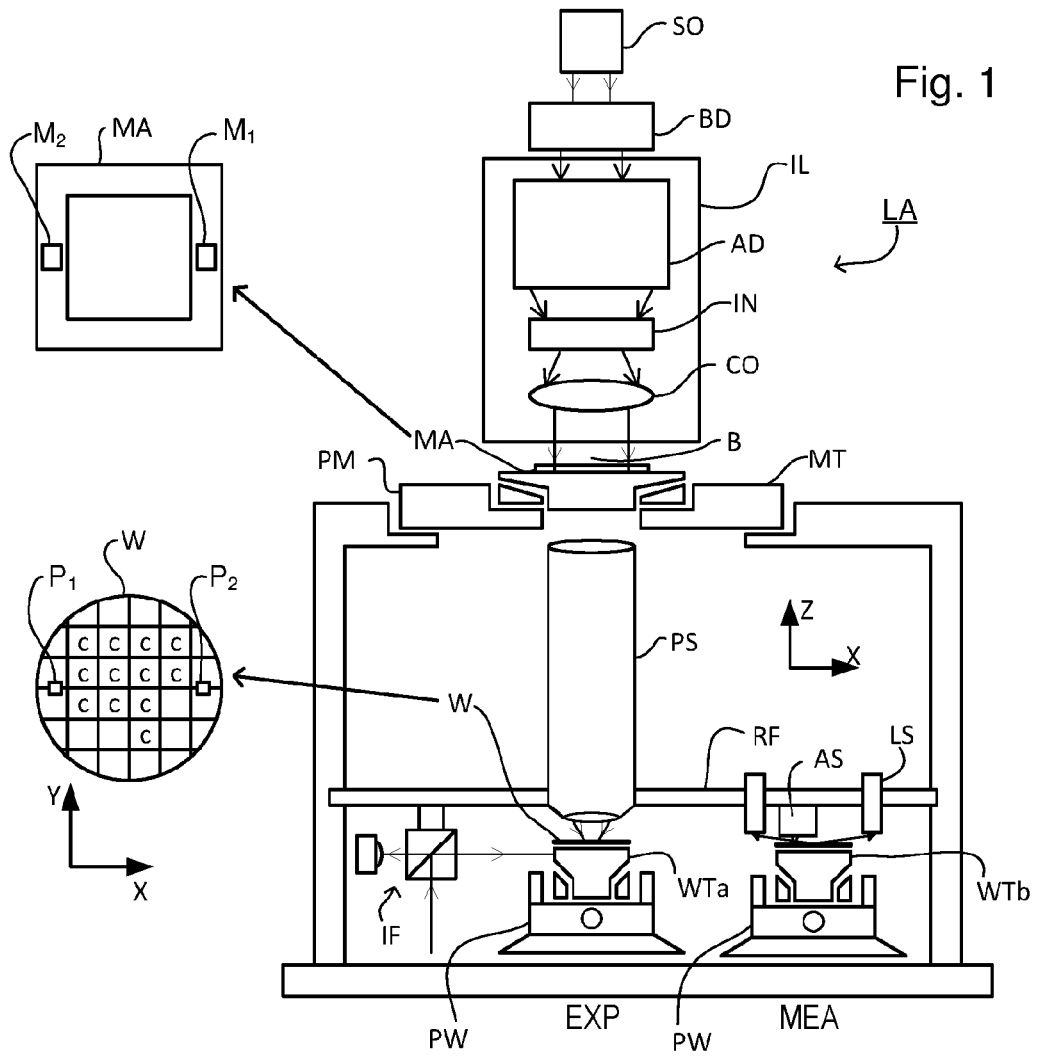
FIG. 1 depicts a lithographic apparatus according to an embodiment of the invention.

FIG. 1 schematically depicts a lithographic apparatus LA. The apparatus includes an illumination optical system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection optical system (e.g., a refractive projection lens system) PS configured to project a pattern imparted to the radiation beam B by patterning device MA onto a target portion C (e.g., including one or more dies) of the substrate W.

The illumination optical system may include various types of optical or non-optical components, such as refractive, reflective, magnetic, electromagnetic, electrostatic or other types of components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection optical system PS, which focuses the beam onto a target portion C of the substrate W, thereby projecting an image of the pattern on the target portion C. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

Lithographic apparatus LA in this example is of a so-called dual stage type which has two substrate tables WTa, WTb and two stations—an exposure station and a measurement station—between which the substrate tables can be exchanged. While one substrate on one substrate table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS. This enables a substantial increase in the throughput of the apparatus.

The depicted apparatus can be used in a variety of modes, including for example a step mode or a scan mode. The construction and operation of lithographic apparatus is well known to those skilled in the art and need not be described further for an understanding of the present invention.

Figure 2:
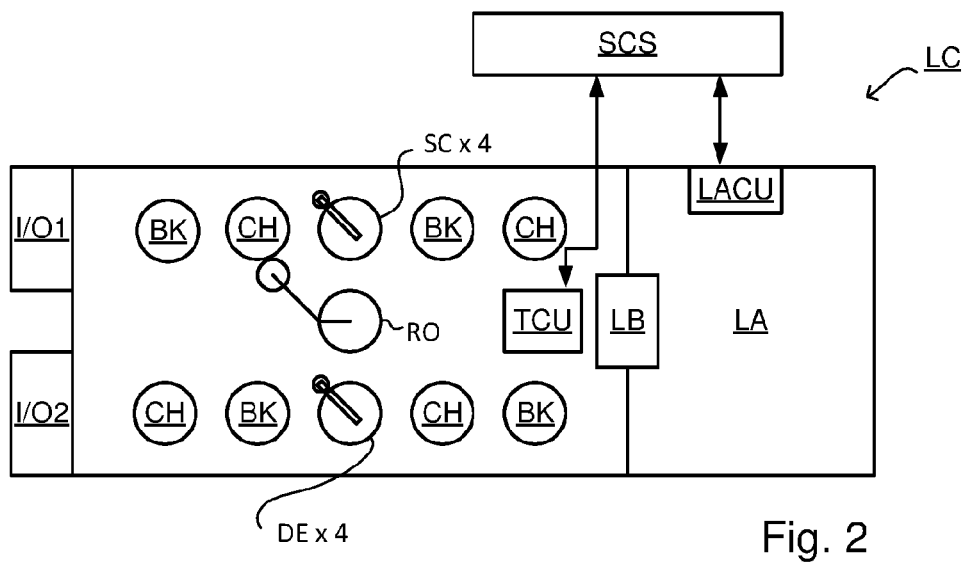
FIG. 2 depicts a lithographic cell or cluster according to an embodiment of the invention.

As shown in FIG. 2, the lithographic apparatus LA forms part of a lithographic system, referred to as a lithographic cell LC or a lithocell or cluster. The lithographic cell LC may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which lithocell LC is located also includes metrology system MET which receives some or all of the substrates W that have been processed in the lithocell. Metrology results are provided directly or indirectly to the supervisory control system SCS. If errors are detected, adjustments may be made to exposures of subsequent substrates, especially if the inspection can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Within metrology system MET, an inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast—there is only a very small difference in refractive index between the parts of the resist which have been exposed to radiation and those which have not—and not all inspection apparatuses have sufficient sensitivity to make useful measurements of the latent image. Therefore measurements may be taken after the post-exposure bake step (PEB) which is customarily the first step carried out on exposed substrates and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibilities for rework of faulty substrates but may still provide useful information.

A metrology apparatus is shown in FIG. 3(a). A target T and diffracted rays of measurement radiation used to illuminate the target are illustrated in more detail in FIG. 3(b). The metrology apparatus illustrated is of a type known as a dark field metrology apparatus. The metrology apparatus depicted here is purely exemplary, to provide an explanation of dark field metrology. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

As shown in FIG. 3(b), target T is placed with substrate W normal to the optical axis O of objective lens 16. The substrate W may be supported by a support (not shown). A ray of measurement radiation I impinging on target T from an angle off the axis O gives rise to a zeroth order ray (solid line 0) and two first order rays (dot-chain line +1 and double dot-chain line −1). It should be remembered that with an overfilled small target, these rays are just one of many parallel rays covering the area of the substrate including metrology target T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the targets and the illumination angles can be designed or adjusted so that the first order rays entering the objective lens are closely aligned with the central optical axis. The rays illustrated in FIGS. 3(a) and 3(b) are shown somewhat off axis, purely to enable them to be more easily distinguished in the diagram.

At least the 0 and +1 orders diffracted by the target T on substrate W are collected by objective lens 16 and directed back through beam splitter 15. Returning to FIG. 3(a), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction.

In the second measurement branch, optical system 20, 22 forms an image of the target T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 3 are purely examples. In another embodiment of the invention, on-axis illumination of the targets is used and an aperture stop with an off-axis aperture is used to pass substantially only one first order of diffracted light to the sensor. In other examples, a two quadrant aperture may be used. This may enable simultaneous detection of plus and minus orders, as described in US2010201963A1, mentioned above. Embodiments with optical wedges (segmented prisms or other suitable elements) in the detection branch can be used to separate the orders for imaging spatially in a single image, as described in US2011102753A1, mentioned above. In yet other embodiments, $2^{nd}$, $3^{rd}$ and higher order beams (not shown in FIG. 3) can be used in measurements, instead of or in addition to the first order beams. In yet other embodiments, a segmented prism can be used in place of aperture stop 21, enabling both +1 and −1 orders to be captured simultaneously at spatially separate locations on image sensor 23.

In order to make the measurement radiation adaptable to these different types of measurement, the aperture plate 13 may comprise a number of aperture patterns formed around a disc, which rotates to bring a desired pattern into place. Note that aperture plate 13N or 13S can only be used to measure gratings oriented in one direction (X or Y depending on the set-up). For measurement of an orthogonal grating, rotation of the target through 90° and 270° might be implemented. Different aperture plates are shown in FIGS. 3(c) and (d). The use of these, and numerous other variations and applications of the apparatus are described in prior published applications, mentioned above.

FIG. 4 depicts an overlay target or composite overlay target formed on a substrate according to known practice. The overlay target in this example comprises four sub-targets (e.g., gratings) 32 to 35 positioned closely together so that they will all be within a measurement spot 31 formed by the metrology radiation illumination beam of the metrology apparatus. The four sub-overlay targets thus are all simultaneously illuminated and simultaneously imaged on sensor 23. In an example dedicated to measurement of overlay, sub-targets 32 to 35 are themselves composite structures formed by overlying gratings that are patterned in different layers of the semiconductor device formed on substrate W. Sub-targets 32 to 35 may have differently biased overlay offsets in order to facilitate measurement of overlay between the layers in which the different parts of the composite sub-targets are formed. Sub-targets 32 to 35 may also differ in their orientation, as shown, so as to diffract incoming radiation in X and Y directions. In one example, sub-targets 32 and 34 are X-direction sub-targets with biases of the +d, −d, respectively. Sub-targets 33 and 35 are Y-direction sub-targets with offsets +d and −d respectively. Separate images of these sub-targets can be identified in the image captured by sensor 23. This is only one example of an overlay target. An overlay target may comprise more or fewer than 4 sub-targets.

FIG. 5 shows an example of an image that may be formed on and detected by the sensor 23, using the overlay target of FIG. 4 in the apparatus of FIG. 3, using the aperture plates 13NW or 13SE from FIG. 3(d). While the pupil plane image sensor 19 cannot resolve the different individual sub-targets 32 to 35, the image sensor 23 can do so. The hatched area 40 represents the field of the image on the sensor, within which the illuminated spot 31 on the substrate is imaged into a corresponding circular area 41. Within this, rectangular areas 42-45 represent the images of the small overlay target sub-targets 32 to 35. If the overlay targets are located in product areas, product features may also be visible in the periphery of this image field. Image processor and controller PU processes these images using pattern recognition to identify the separate images 42 to 45 of sub-targets 32 to 35. In this way, the images do not have to be aligned very precisely at a specific location within the sensor frame, which greatly improves throughput of the measuring apparatus as a whole.

Once the separate images of the overlay targets have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance is an important example of such a parameter.

Using for example the method described in applications such as US20110027704A, mentioned above, overlay error (i.e., undesired and unintentional overlay misalignment) between the two layers within the sub-targets 32 to 35 is measured. Such a method may be referred to as micro diffraction based overlay (µDBO). This measurement may be done through overlay target asymmetry, as revealed by comparing their intensities in the +1 order and −1 order dark field images (the intensities of other corresponding higher orders can be compared, e.g. +2 and −2 orders) to obtain a measure of the intensity asymmetry.

When performing a measurement on a diffractive target, there is a requirement that the diffracted radiation both propagates out of the stack and in a direction where it will be captured by the collection NA. Such a requirement puts an effective restriction on the wavelengths and/or pitches usable for such methods, or more specifically an effective restriction on the ratio of wavelength-to-pitch. During a measurement of an overlay target, the measurement illumination is diffracted at both the top and the bottom grating by $\sin(\lambda)=$, $\lambda/p$, with $\lambda$ the wavelength of the measurement illumination and p the pitch (period) of the grating. If the wavelength is too long and/or the pitch of the grating too small, the diffracted light either will not propagate out of the stack or is diffracted to an angle outside of the collection NA, and cannot be collected by the optics.

A method and associated target arrangement will now be described which increases flexibility in the choice of the wavelength(s) which may be used for the measurement illumination for measurement of a target and/or at least one grating pitch of such a target.

Present overlay metrology relies on so-called single (e.g., first order) diffraction of light from both a top grating and a bottom grating. In such a single diffraction regime, the targets will have a pitch p above the single diffraction limit, i.e.: $p > \lambda/(2NA)$ where NA is the (largest or effective) collection numerical aperture of the system. The overlay signal is encoded in the intensity imbalance between measurement images (e.g., dark field images) or Moiré patterns from the measurement images, depending on the target type. In order for the metrology sensor to illuminate a target with sufficiently high oblique angles and to collect the diffracted light efficiently, the sensor should be high NA.

The concepts disclosed herein seek to employ the mechanism of double diffraction, i.e., two sequential first (or equal) order diffractions of opposite sign, e.g., to effectively lower the usable pitch of both the top grating and bottom grating. This approach allows the ratio of (e.g., longest) measurement wavelength to target pitch (of the top and bottom targets) to be increased and therefore allows either a longer wavelength to be used and/or a smaller target pitch to be used, than would be possible otherwise for a particular metrology tool. For example, such a method may allow a target pitch to be lowered to that closer to that of a device resolution or device pitch. A target of similar pitch or resolution to that of the relevant device structure is typically more accurate as it is more likely to behave similarly to the product structure.

To achieve this, measurement of a target arrangement is proposed which comprises an additional mediator periodic structure or mediator grating and where the pitch of all the component periodic structures or gratings are below the single diffraction limit of $\lambda/(2NA)$ where $\lambda$ is the relevant measurement radiation (which may include the longest wavelength of a plurality of wavelengths or range of wavelengths used in a multiple wavelength or broadband measurement) and NA is the effective collection aperture.

A first embodiment will be described, based on µDBO techniques and target arrangements as described in relation to FIGS. 4 and 5. Such µDBO techniques are based on measurement of target arrangements where each target comprises two gratings having equal pitch, each in a respective layer. In this embodiment, an additional mediator grating is provided, which may be located between the two DBO gratings of the target structure, or below both of them.

The concept of a double diffracting grating pair can be considered to comprise one of a top grating and bottom grating of an overlay target and the mediator grating; i.e., such that an overlay target according to concepts disclosed herein comprises two double diffracting grating pairs. Under double diffraction, the effective pitch $p_{DD}$ of the double diffracting grating pair is:

$$p_{DD} = \frac{p_1 p_2}{|p_1 - p_2|} = M_{DD} p_1$$

The mediator grating provides a (common) mediator pitch $p_2$, which enables retrieval of a first order wave diffracted from a (e.g., small pitch) first grating having a first pitch $p_1$, which might otherwise be too small for the wavelength used and sensor parameters. $M_{DD}$ is an effective pitch multiplier $M_{DD}$ for the first pitch $p_1$, i.e.:

$$M_{DD} = \frac{p_2}{|p_1 - p_2|}$$

where $p_1$ is the overlay grating pitch and $p_2$ is the mediator grating pitch of the double diffracting grating pair. Assuming that the pitches $p_1$, $p_2$ are not equal (a requirement to avoid both gratings acting together to generate an effective $0^{th}$ order) then the multiplier is typically $>>1$. It is this which allows a higher wavelength or smaller grating pitches to be used.

Figure 6A:
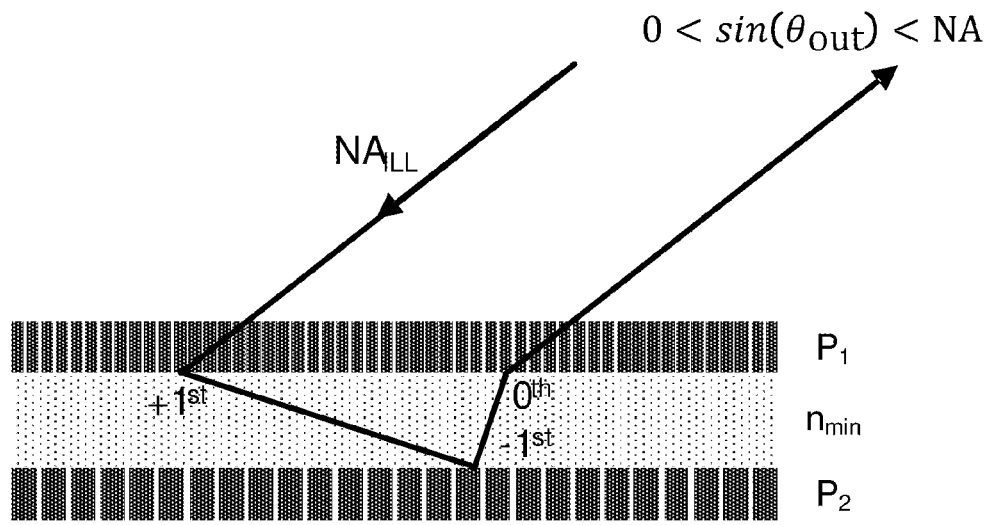
FIGS. 6A and 6B are a schematic illustration of a first double diffraction pair of gratings illustrating a double diffraction metrology principal according to an embodiment and FIG. 6A showing a first signal path and FIG.
Figure 6B:
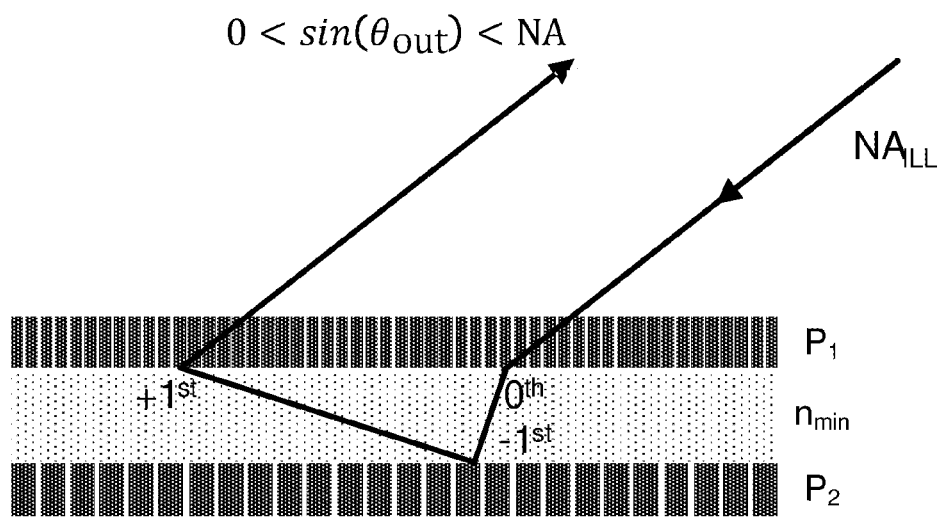

FIGS. 6(a) and 6(b) illustrate this principle for a first double diffracting grating pair P1, P2 having pitches $p_1$, $p_2$ respectively and intervening stack material having a lowest refractive index $n_{min}$. FIG. 6(a) shows a double diffraction first signal path and FIG. 6(b) shows a double diffraction second signal path, being the time reversed first signal path. In each case, a single ray of the measurement illumination is shown signifying the illumination NA $NA_{ILL}$. Specifically (but purely for illustration) the ray shown is Littrow ray; i.e., the ray that, after first order diffraction, retraces its path along the direction of the illumination ray. Grating P1 may be equivalent of a mediator grating and the Grating P2 may be equivalent to a bottom grating of an overlay target. In FIG. 6(a), the illumination undergoes first diffraction +1 at grating P1 and second diffraction −1 at second grating P2. In FIG. 6(b) this is reversed.

Figure 7A:
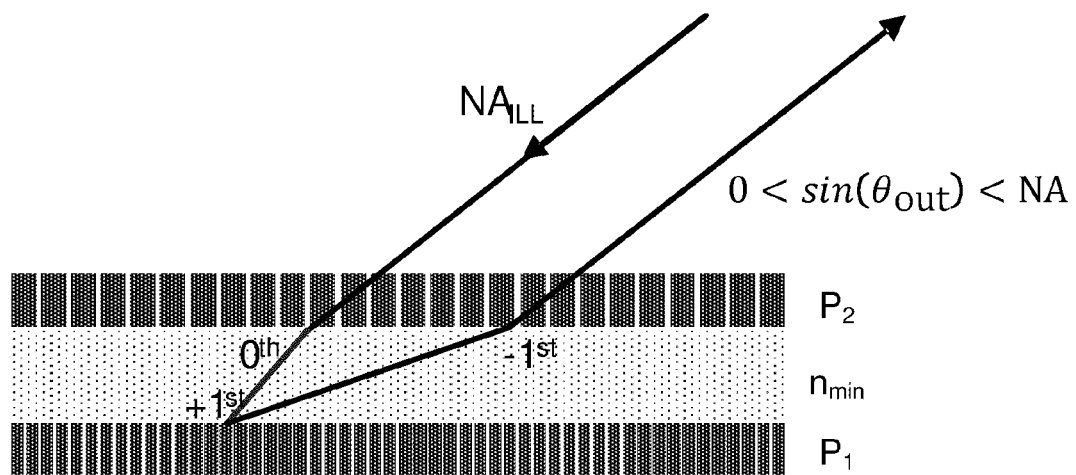
FIGS. 7A and 7B are a schematic illustration of a second double diffraction pair of gratings illustrating a double diffraction metrology principal according to an embodiment and FIG. 7A showing a first signal path and FIG. 7B showing a second signal path being the time reversed signal path of the first signal path.
Figure 7B:
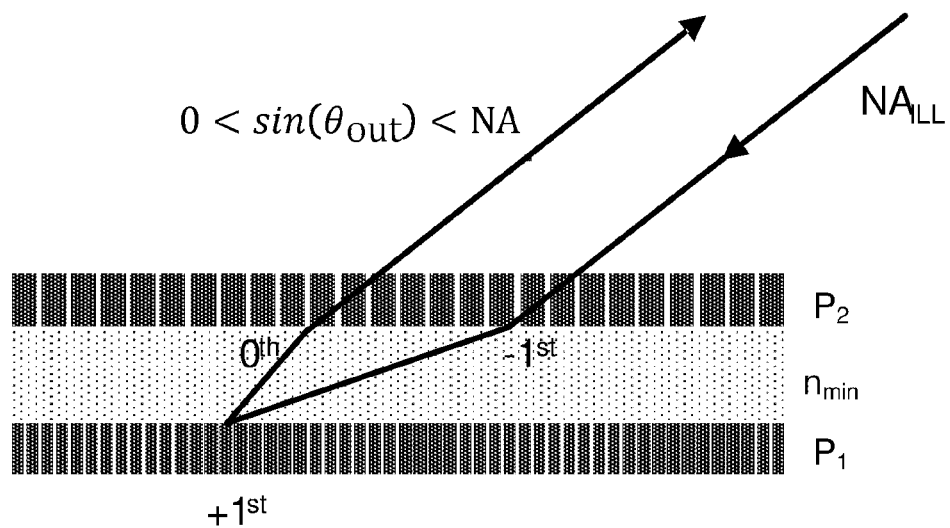

FIGS. 7(a) and 7(b) show the equivalent signal paths as those of FIGS. 6(a) and 6(b), other than the gratings being swapped in position. This arrangement may be equivalent to a second double diffracting grating pair comprising Grating P2, which may be equivalent of a top grating of an overlay target, and grating P1, which may be equivalent to the mediator grating.

Referring to the first path of FIGS. 6(a) and 7(a), the wave must propagate in stack; this sets a lower wavelength bound of:

$$\lambda < (n_{min} + NA_{ILL}) p_1.$$

Referring to the second, reversed path of FIGS. 6(b) and 7(b), the same propagation condition sets a lower bound:

$$\lambda < (n_{min} - NA_{ILL}) p_2$$

In both first and second signal paths, after double diffraction, the wave must be collected by optics; this sets upper and lower wavelength bounds:

$$NA_{ILL}\left(\frac{p_2 p_1}{p_2 - p_1}\right) < \lambda < (NA_{ILL} + NA)\left(\frac{p_2 p_1}{p_2 - p_1}\right)$$

where $NA_{ILL}$ is the illumination NA and is the collection NA.

Figure 8:
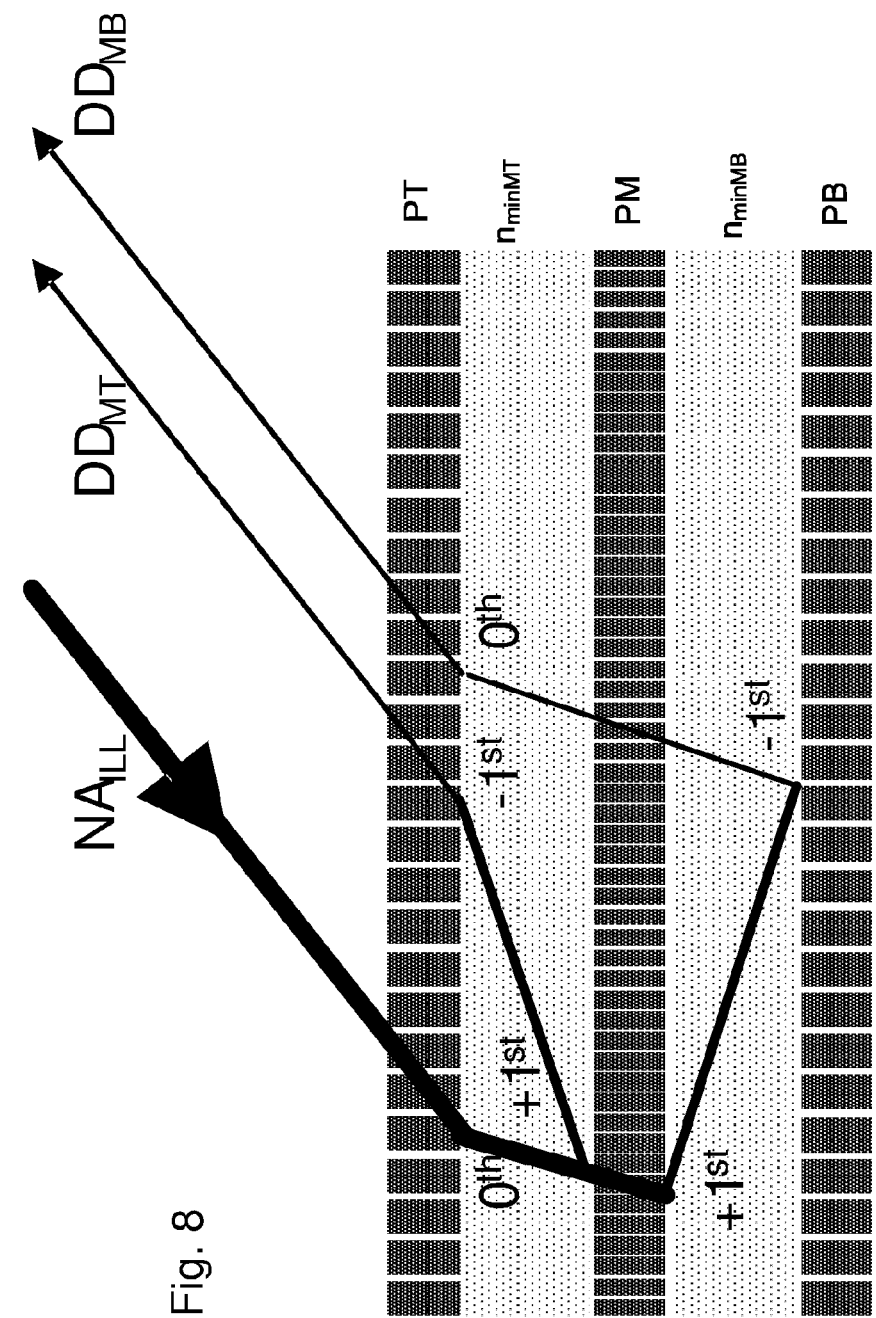
FIG. 8 is a schematic illustration of a first double diffraction overlay target according to an embodiment the invention.

FIG. 8 illustrates such a double diffraction overlay target according to concepts described herein. The target comprises first (top) grating PT and second (bottom) target grating PB of equal pitch $p_T = p_B = p$ and an additional mediator grating PM having pitch $p_M$ where $p_M \neq p$. All three gratings have a pitch p, $p_M$ below the single diffraction limit of $\lambda/(2NA)$. In the Figure, the mediator grating is shown between the two gratings PT, PB; however it may instead be located beneath both of these gratings (i.e., beneath the overlay target).

To extract overlay from such a target, it can be appreciated that phase $\varphi_{MT,\pm 1}$ accumulated in MT path to provide double diffracted radiation $DD_{MT}$ is:

$$\varphi_{MT,\pm 1} = \mp \alpha_M + \pi \pm \alpha_T + \beta_{MT}$$

and the phase accumulated in MB path to provide double diffracted radiation $DD_{MB}$ is:

$$\varphi_{MB,\pm 1} = \mp \alpha_M \pm \alpha_B + \pi + \beta_{MB}$$

where:

$$\Delta \varphi_{\pm 1} = (\beta_{MT} - \beta_{MB}) \pm (\alpha_T - \alpha_B) = \Delta \beta \pm \frac{2\pi OV_{TB}}{p}$$

$x_{T,M,B}$ is the relative position of each grating and $\beta_{MT,MB} = OPD_{MT,MB}$ is the optical path distance (i.e., the phase difference due to the optical paths).

The phase difference is:

$$\alpha_{T,M,B} = \frac{2\pi x_{T,M,B}}{p_{T,M,B}},$$

where $\Delta \beta = \beta_{MT} - \beta_{MB}$ and $OV_{TB} = x_T - x_B$ is the overlay being determined. The first term $\Delta \beta$ is a wavelength dependent phase offset due to path differences in the stack (this is the main reason for stack sensitivity and resultant "swing curve" in μDBO) and the second term describes the overlay phase. As such, where phase is available (e.g., where phase extraction methods are performed such as disclosed in US patent application US2020/0041563, incorporated herein by reference) it is possible to extract overlay from a measured phase difference between first double diffraction radiation having diffracted sequentially from the top target grating and mediator grating and second double diffraction radiation having diffracted sequentially from the bottom target grating and mediator grating. Note that in this context, diffracted sequentially may mean diffracted from the top/bottom target grating first and mediator grating second or vice versa.

However, it is also possible to extract overlay using conventional μDBO techniques; i.e., from an intensity difference between complementary diffraction orders (e.g., with two biased targets provided to separate other asymmetries from overlay).

In contrast to the target arrangement of FIG. 4, another type of overlay target (which may be referred to as a continuous DBO or cDBO target) may comprise a type A target or a pair of type A targets (e.g., per direction) having a grating with first pitch $p_1$ on top of grating with second pitch $p_2$ and a type B target or pair of type B targets for which these gratings are swapped such that a second pitch $p_2$ grating is on top of a first pitch $p_1$ grating. In this manner, and in contrast to the target arrangements illustrated in FIG. 4, the target bias changes continuously along each target. The overlay signal is encoded in the Moiré patterns from (e.g., dark field) images (and as such, the targets may be measured using image based metrology tools). Conventionally for such targets, and for the cDBO embodiments disclosed herein, the overlay OV can be extracted from the phase differences $\Delta\varphi_{norm}$, $\Delta\varphi_{comp}$ between the type A and type B target images in respectively normal and complementary images (e.g., Fourier plane images from a +1 diffraction order and −1 diffraction order respectively) according to the following equation:

$$OV = \frac{1}{4\pi} \frac{p_1 p_2}{p_2 + p_1} [\Delta\varphi_{norm} + \Delta\varphi_{comp}]$$

where phase can be measured from each image as the distance between fringes of a target region (e.g., intensity fringes).

Figure 9:
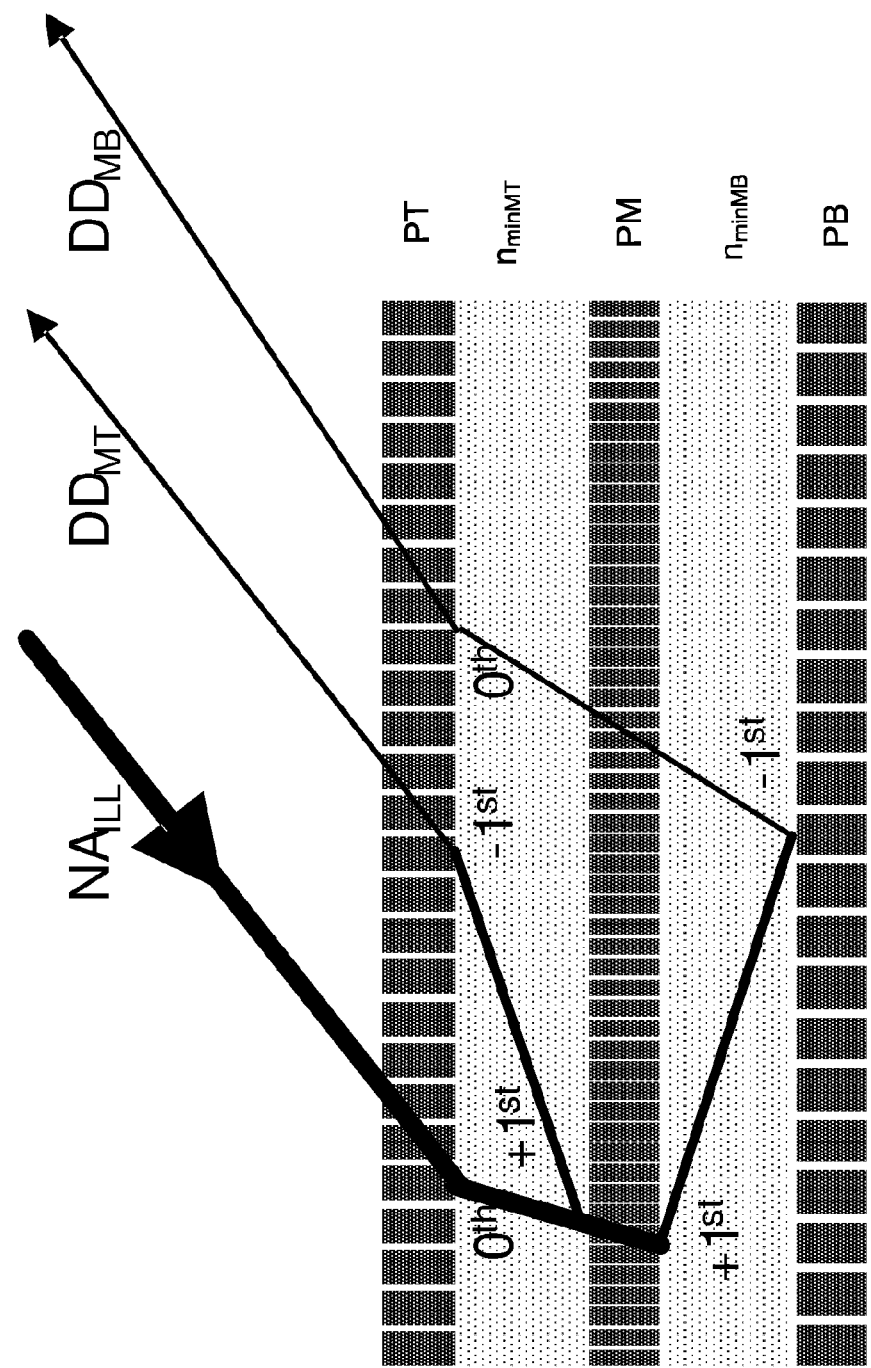
FIG. 9 is a schematic illustration of a second double diffraction overlay target according to an embodiment the invention.

FIG. 9 illustrates a variation of the target of FIG. 8, for this other type of overlay target. The difference between this target and the target of FIG. 8 is that the pitches of the gratings PT and PB are different; i.e., $p_T \neq p_B$. The illumination light is diffracted at both the top grating and the bottom grating respectively by the angles $\sin \theta_{T,P} = \lambda/p_{T,B}$.

In this embodiment, the phase accumulated in MT path is:

$$\varphi_{MT,\pm 1} = \mp\alpha_M + \pi \pm \alpha_T + \beta_{MT}$$

and the phase accumulated in MB path is:

$$\varphi_{MB,\pm 1} = \mp\alpha_M \pm \alpha_B + \pi + \beta_{MB}$$

Therefore the phase difference is:

$$\Delta\varphi_{\pm 1} = (\beta_{MT} - \beta_{MB}) \pm (\alpha_T - \alpha_B)$$

$$= \Delta\beta \pm \left(\frac{x_T}{p_T} - \frac{x_B}{p_B}\right)$$

where $$\alpha_{T,M,B} = \frac{2\pi x_{T,M,B}}{p_{T,M,B}},$$

$\beta_{MT,MB} = OPD_{MT,MB}$ and $p_T \neq p_B \neq p_M$. The first term $\Delta\beta$ is a trivial swing curve which can be eliminated by normal and complementary phase addition (an advantage of cDBO over µDBO). The difference term in the brackets describes the Moiré phase giving rise to fringes. The overlay can therefore be extracted from the observed Moiré phase (for all four signal paths), bearing in mind that $OV_{TB} = x_T - x_B$.

In general, such a target arrangement comprising 3 gratings will emit double diffraction waves under the following angles:

$$NA_{MT} = -NA_{ILL} \pm \lambda\left(\frac{1}{p_M} - \frac{1}{p_T}\right) = -NA_{ILL} \pm \frac{\lambda}{p_{MT}} \quad \text{Eq 1}$$

$$NA_{MB} = -NA_{ILL} \pm \lambda\left(\frac{1}{p_M} - \frac{1}{p_B}\right) = -NA_{ILL} \pm \frac{\lambda}{p_{MB}} \quad \text{Eq 2}$$

$$NA_{TB} = -NA_{ILL} \pm \lambda\left(\frac{1}{p_T} - \frac{1}{p_B}\right) = -NA_{ILL} \pm \frac{\lambda}{p_{TB}} \quad \text{Eq 3}$$

The following combinations interfere to form the corresponding spatial periods and allow for multi-layer overlay to be determined. More specifically the following overlay values $OV_{TB}$ (between top and bottom layers), $OV_{MB}$ (between the middle or mediator grating later and bottom layer) $OV_{MT}$ (between the middle or mediator grating later and top layer) may be extracted depending on which spatial period is filtered from the image:

$$p_{TB} = \frac{p_T p_B}{|p_T - p_B|}, OV_{TB} \quad \text{Eq 1 + Eq 2}$$

and, depending on the sign of $p_T - p_B$:

$$p_{MB} = \frac{p_M p_B}{|p_M - p_B|}, OV_{MB}; \text{ or} \quad \text{Eq 1 + Eq 3}$$

$$p_{MT} = \frac{p_M p_T}{|p_M - p_T|}, OV_{MT} \quad \text{Eq 2 + Eq 3}$$

For example, interference of double diffraction described by Eq 1 and Eq 2 may be described by the spatial period $$p_{TB} = \frac{p_T p_B}{|p_T - p_B|}$$

and as such, a filtered signal relating to this spatial period will yield overlay $OV_{TB}$. For example, by performing a suitable (e.g., Fourier) filtering, a frequency component of interest can be isolated, and hence, overlay for a particular layer pair can be obtained (in a non-redundant way), e.g., using the equation for cDBO overlay provided at the beginning of the cDBO section.

It should be noted that FIGS. 8 and 9 show only the forward signal path. The time reversed signal paths are not shown. Also, as is known, a target arrangement or target may comprise multiple sub-targets each being comprised of such a sub-structure and each having (in the case of the FIG. 8 example) different biases or (in the case of the FIG. 9 example), the top and bottom gratings swapped. Different pairs of sub-targets for the two directions of the substrate plane may be provided.

In a further embodiment, it is proposed that a partial double diffraction cDBO target is measured, the partial double diffraction cDBO target comprising only two gratings instead of three, where the pitch of only one of these gratings (i.e., the mediator grating) is below the single diffraction limit. In other words, it is possible to perform cDBO metrology according to concepts disclosed herein, by bringing the lowest pitch of a regular cDBO target below the single diffraction threshold, albeit with reduced contrast.

Figure 10A:
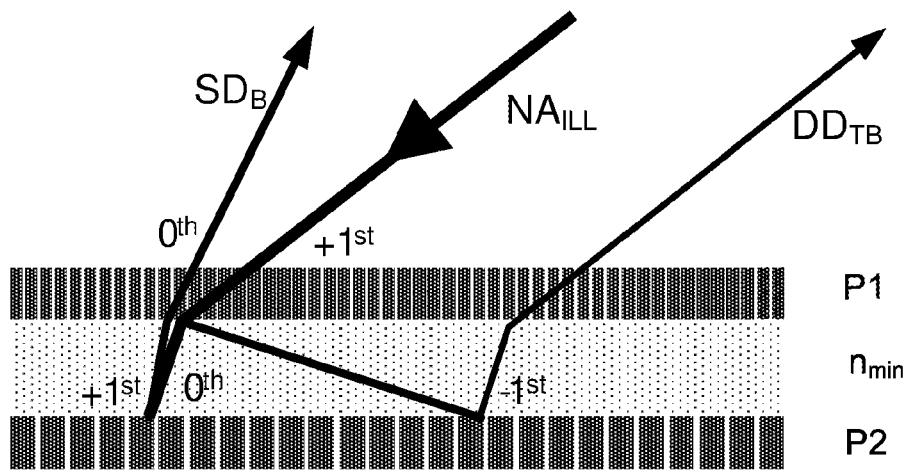
FIGS. 10A and 10B are a schematic illustration of a third double diffraction overlay target according to an embodiment the invention, and FIG. 10A showing a first sub-target and FIG. 10B a second sub-target.
Figure 10B:
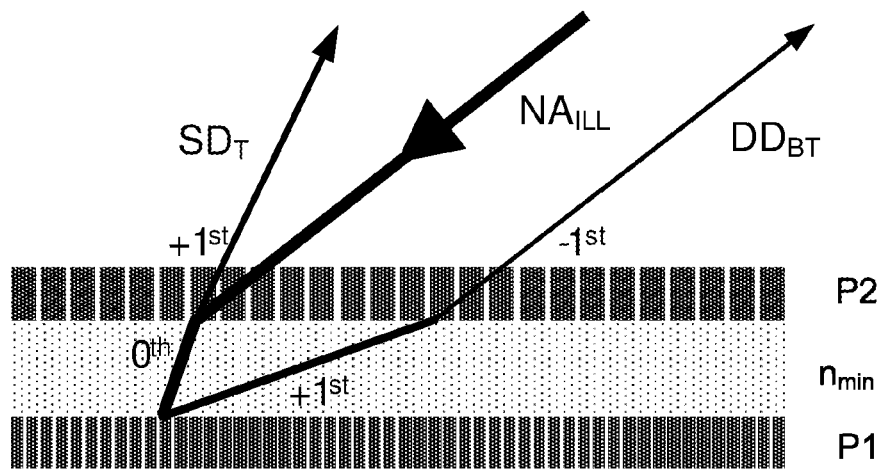

FIG. 10 illustrates such an embodiment, and shows (a) a type A target where the top grating P1 is the mediator grating with a pitch below the single diffraction limit and the bottom grating P2 has a pitch above the single diffraction limit and (b) a type B target where these gratings are reversed. For the type A target, single diffraction radiation $SD_B$ from the bottom grating P2 and double diffraction radiation $DD_{TB}$ having diffracted respectively from the top grating P1 and bottom grating P2 is generated. For the type B target, single diffraction radiation $SD_T$ from the top grating P1 and double diffraction radiation $DD_{BT}$ having diffracted respectively from the bottom grating P1 and top grating P2 is generated.

The effective pitch multiplier is the same as has already been described for the full double-diffraction embodiments, and once again overlay may be extracted from the Moiré fringe position difference as is known for cDBO.

In all the embodiments described above, the usable wavelength to pitch ratio may be greater than 2, greater than 2.5 or greater than 3 or greater than 3.5 for example. In this context, the relevant wavelength (where more than one wavelength is used for a measurement) may be the longest wavelength, and the relevant pitch may be the smallest pitch or smallest non-mediator pitch comprised in the target.

The targets described above are all overlay targets. However, the concept may be applicable to any target which comprise periodic gratings; e.g., targets suitable to measure overlay, focus, dose or physical parameters of the device structures present on the lithographic wafer, such as tilt, side wall angles, critical dimension and other dimension of interest. For non-overlay examples, typically only two gratings (the metrology grating and the mediator grating) will be required. The targets within the target arrangement may be target suitable for Image based metrology (IBO), for diffraction based metrology (DBO) or other forms of metrology. Such a target arrangement may be manifested on a substrate (e.g., as printed) or on one or more patterning devices (e.g., three patterning devices to form the three layers of the target arrangement (for the three gratings) when the parameter of interest is overlay).

As such, method disclosed herein comprise measuring any of the targets disclosed herein and determining a parameter of interest from the (at least partially) double diffracted radiation scattered by the target. The determined parameter of interest may be used in control of the lithographic process in a known manner, e.g., to minimize an error in the parameter of interest.

It can be appreciated that all the specific arrangements shown are purely examples and there many possible target arrangements which fall within the scope of the present disclosure. For example, a target arrangement may only comprise target regions for measuring in only a single direction or in two directions. Also spacing can be added between the pads to counter crosstalk and/or parallax issues. The target arrangements illustrated have been those designed for measurement of overlay.

While the targets described above are metrology targets specifically designed and formed for the purposes of measurement, in other embodiments, properties may be measured on targets which are functional parts of devices formed on the substrate. Many devices have regular, grating-like structures. The terms 'target grating' and 'target' as used herein do not require that the structure has been provided specifically for the measurement being performed. In such an embodiment, either the target gratings and mediator grating may all comprise product structure, or only one or both target gratings comprise product structure, with the mediator grating being specifically formed to mediate the allowable pitches, and therefore enable measurements directly on the product structure. Further, pitch of the metrology targets is close to the resolution limit of the optical system of the scatterometer, but may be much larger than the dimension of typical product features made by lithographic process in the target portions C. In practice the lines and/or spaces of the overlay gratings within the targets may be made to include smaller structures similar in dimension to the product features.

In association with the physical grating structures of the targets realized on substrates and patterning devices, an embodiment may include a computer program containing one or more sequences of machine-readable instructions describing methods of measuring targets on a substrate and/or analyzing measurements to obtain information about a lithographic process. This computer program may be executed for example within unit PU in the apparatus of FIG. 3 and/or the control unit LACU of FIG. 2. There may also be provided a data storage medium (e.g., semiconductor memory, magnetic or optical disk) having such a computer program stored therein. Where an existing metrology apparatus, for example of the type shown in FIG. 3, is already in production and/or in use, the invention can be implemented by the provision of updated computer program products for causing a processor to perform the steps necessary to calculate the overlay error.

The program may optionally be arranged to control the optical system, substrate support and the like to perform the steps necessary to calculate the overlay error for measurement of asymmetry on a suitable plurality of targets.

Further embodiments according to the present invention are described in below numbered clauses:

1. A method of measuring a target on a substrate comprising:
    illuminating a target with measurement radiation comprising at least a first wavelength to obtain resultant scattered radiation having been scattered by said target;
    collecting said scattered radiation within a collection numerical aperture; and
    determining a parameter of interest from said scattered radiation;
    wherein the target comprises a mediator periodic structure and at least a first target periodic structure each in a respective different layer on the substrate, wherein a pitch of at least the mediator periodic structure is below a single diffraction limit defined by the collection numerical aperture and a wavelength of said measurement radiation, such that said scattered radiation comprises double diffracted radiation, said double diffracted radiation comprising radiation having undergone two sequential same-order diffractions of opposite sign.
2. A method according to clause 1, wherein said two sequential same-order diffractions of opposite sign comprise two sequential first-order diffractions of opposite sign.
3. A method according to clause 1 or 2, wherein said two sequential same-order diffractions are diffracted sequentially at said first target periodic structure and said mediator periodic structure.
4. A method according to any preceding clause, wherein said at least a first periodic structure comprises a pitch which is below said single diffraction limit.
5. A method according to any preceding clause, wherein a mediator pitch of said mediator periodic structure is smaller than a pitch or each pitch of said at least a first periodic structure.
6. A method according to any preceding clause, wherein said at least a first periodic structure comprises a first periodic structure and a second periodic structure each in a respective different layer on the substrate.
7. A method according to clause 6, wherein said mediator periodic structure is located between or beneath said first periodic structure and said second periodic structure.
8. A method according to clause 6 or 7, wherein said first periodic structure and said second periodic structure comprise the same pitch, said pitch being different to a mediator pitch of said mediator periodic structure.

9. A method according to clause 8, wherein said parameter of interest is determined from a measured phase difference between first double diffraction radiation having diffracted sequentially from the top target grating and mediator grating and second double diffraction radiation having diffracted sequentially from the bottom target grating and mediator grating.

10. A method according to clause 6 or 7, wherein said first periodic structure, said second periodic structure and said mediator periodic structure all comprise a different respective pitch.

11. A method according to clause 10, wherein said parameter of interest is determined from a pitch of a detected Moiré pattern obtained from the scattered radiation.

12. A method according to clause 11, wherein said scattered radiation comprises a contributor Moiré pattern resultant for each respective periodic structure pair comprised within the target, and the method comprises:
filtering the scattered radiation to obtain one of said contributor Moiré patterns relating to a chosen periodic structure pair; and
determining the parameter of interest relating to the layers corresponding to the chosen periodic structure pair from said one of said contributor Moiré patterns obtained at the filtering step.

13. A method according to any of clauses 6 to 12, wherein said parameter of interest is overlay between a first layer comprising said first periodic structure and a second layer comprising said second periodic structure.

14. A method according to any preceding clause wherein the wavelength λ is related to a pitch of at least said first target periodic structure $p_1$. and the pitch $p_2$ of said mediator periodic structure meets the following criteria:

$\lambda < (n_{min} + NA_{ILL})$;

$\lambda < (n_{min} - NA_{ILL})p_2$; and $NA_{ILL}\left(\frac{p_2 p_1}{p_2 - p_1}\right) < \lambda < (NA_{ILL} + NA)\left(\frac{p_2 p_1}{p_2 - p_1}\right)$ where $NA_{ILL}$ is the illumination NA, NA is the collection NA and $n_{min}$ is the lowest refractive index in the stack between said first target periodic structure and said mediator periodic structure.

15. A method according to any preceding clause wherein the ratio of said wavelength to the or each pitch of said at least a first target periodic structure is greater than 2.

16. A method according to any preceding clause, wherein the parameter of interest is one of overlay, focus, dose, critical dimension or another physical parameter of the target.

17. A metrology apparatus being operable to perform the method of any preceding clause.

18. A substrate comprising a target, wherein the target comprises a mediator periodic structure and at least a first target periodic structure, each in a respective different layer on the substrate, wherein a pitch of at least the mediator periodic structure is below 300 nm, such that radiation scattered by the target comprises double diffracted radiation, said double diffracted radiation comprising radiation having undergone two sequential same-order diffractions of opposite sign.

19. A substrate according to clause 18, wherein a pitch of at least the mediator periodic structure is below 200 nm.

20. A substrate according to clause 18, wherein a pitch of at least the mediator periodic structure is below 100 nm.

21. A substrate according to clause 18, wherein said at least a first periodic structure comprises a pitch which is below 300 nm.

22. A substrate according to any of clauses 18 to 21, wherein said at least a first periodic structure comprises a pitch which is below 200 nm.

23. A substrate according to any of clauses 18 to 21, wherein said at least a first periodic structure comprises a pitch which is below 100 nm.

24. A substrate according to any of clauses 18 to 23, wherein a mediator pitch of said mediator periodic structure is smaller than a pitch or each pitch of said at least a first periodic structure.

25. A substrate according to any of clauses 18 to 24, wherein said at least a first periodic structure comprises a first periodic structure and a second periodic structure, each in a respective different layer on the substrate.

26. A substrate according to clause 25, wherein said mediator periodic structure is located between or beneath said first periodic structure and said second periodic structure.

27. A substrate according to clause 25 or 26, wherein said first periodic structure and said second periodic structure comprise the same pitch, said pitch being different to a mediator pitch of said mediator periodic structure.

28. A substrate according to clause 25 or 26, wherein said first periodic structure, said second periodic structure and said mediator periodic structure all comprise a different respective pitch.

29. A set of reticles comprising a respective reticle comprising features for forming each of said periodic structures to form the substrate of any of clauses 18 to 28.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), A well A particle beams, such A ion beams or electron beams.

The term "lens", where the context allows, may refer to any one or combination of various types of components, including refractive, reflective, magnetic, electromagnetic and electrostatic components.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method comprising:

illuminating a target with measurement radiation comprising at least a first wavelength to obtain resultant scattered radiation having been scattered by the target, the target comprising a mediator periodic structure and at least a first target periodic structure each formed in a respective different layer on a substrate, a pitch of at least the mediator periodic structure being below a single diffraction limit defined by a collection numerical aperture and a wavelength of the measurement radiation, such that the scattered radiation comprises double diffracted radiation, the double diffracted radiation comprising radiation having undergone two sequential same-order diffractions of opposite sign;

collecting the scattered radiation within the collection numerical aperture; and determining a parameter of interest from the scattered radiation.

2. The method of claim 1, wherein the two sequential same-order diffractions of opposite sign comprise two sequential first-order diffractions of opposite sign.

3. The method of claim 1, wherein the two sequential same-order diffractions are diffracted sequentially at the first target periodic structure and the mediator periodic structure.

4. The method of claim 1, wherein the at least a first target periodic structure comprises a pitch which is below the single diffraction limit.

5. The method of claim 1, wherein a mediator pitch of the mediator periodic structure is smaller than a pitch or each pitch of the at least a first target periodic structure.

6. The method of claim 1, wherein the wavelength $\lambda$ is related to a pitch of at least the first target periodic structure $p_1$ and the pitch $p_2$ of the mediator periodic structure meets the following criteria:

$$\lambda < (n_{min} + NA_{ILL});$$

$$\lambda < (n_{min} - NA_{ILL})p_2; \text{ and}$$

$$NA_{ILL}\left(\frac{p_2 p_1}{p_2 - p_1}\right) < \lambda < (NA_{ILL} + NA)\left(\frac{p_2 p_1}{p_2 - p_1}\right)$$

where $NA_{ILL}$ is an illumination NA, NA is a collection NA and $n_{min}$ is a lowest refractive index in a stack between the first target periodic structure and the mediator periodic structure.

7. The method of claim 1, wherein a ratio of the wavelength to each pitch of the at least a first target periodic structure is greater than 2.

8. The method of claim 1, wherein the at least a first target periodic structure comprises a first periodic structure and a second periodic structure each in a respective different layer on the substrate.

9. The method of claim 8, wherein the parameter of interest is overlay between a first layer comprising the first periodic structure and a second layer comprising the second periodic structure.

10. The method of claim 8, wherein the first periodic structure and the second periodic structure comprise a same pitch, the pitch being different than a mediator pitch of the mediator periodic structure.

11. The method of claim 10, wherein the parameter of interest is determined from a measured phase difference between first double diffraction radiation having diffracted sequentially from a top target grating and mediator grating and second double diffraction radiation having diffracted sequentially from a bottom target grating and mediator grating.

12. The method of claim 8, wherein the mediator periodic structure is located between or beneath the first periodic structure and the second periodic structure.

13. The method of claim 12, wherein the first periodic structure, the second periodic structure and the mediator periodic structure all comprise a different respective pitch.

14. The method of claim 13, wherein the parameter of interest is determined from a pitch of a detected Moiré pattern obtained from the scattered radiation.

15. The method of claim 13, wherein the scattered radiation comprises a contributor Moiré pattern resultant for each respective periodic structure pair comprised within the target, and the method further comprises:

filtering the scattered radiation to obtain one of the contributor Moiré patterns relating to a chosen periodic structure pair; and determining the parameter of interest relating to the layers corresponding to the chosen periodic structure pair from the one of the contributor Moiré patterns obtained at the filtering.

* * * * *